United States Patent
Yang et al.

(10) Patent No.: US 10,566,243 B2
(45) Date of Patent: Feb. 18, 2020

(54) SEMICONDUCTOR DEVICE HAVING MULTIPLE WORK FUNCTIONS AND MANUFACTURING METHOD THEREOF

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventors: Jiaqi Yang, Shanghai (CN); Jie Zhao, Shanghai (CN)

(73) Assignees: SEMICONDUCTOR MANUFACTURING INTERNATIONATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/919,839

(22) Filed: Mar. 13, 2018

(65) Prior Publication Data
US 2018/0269106 A1 Sep. 20, 2018

(30) Foreign Application Priority Data
Mar. 17, 2017 (CN) .......................... 2017 1 0158470

(51) Int. Cl.
*H01L 21/8234* (2006.01)
*H01L 27/088* (2006.01)
(Continued)

(52) U.S. Cl.
CPC ...... *H01L 21/82345* (2013.01); *H01L 27/088* (2013.01); *H01L 29/4966* (2013.01);
(Continued)

(58) Field of Classification Search
CPC ......... H01L 21/02244; H01L 21/28088; H01L 29/495–4966
See application file for complete search history.

(56) References Cited

U.S. PATENT DOCUMENTS

2013/0334690 A1* 12/2013 Tsai .................. H01L 21/28088
257/751
2014/0239407 A1* 8/2014 Manabe .............. H01L 27/0922
257/369
(Continued)

*Primary Examiner* — Frederick B Hargrove
(74) *Attorney, Agent, or Firm* — Kilpatrick Townsend & Stockton LLP

(57) ABSTRACT

A method of manufacturing a semiconductor device includes providing a substrate structure including a semiconductor substrate, an interlayer dielectric layer on the semiconductor substrate, multiple trenches extending through the interlayer dielectric layer to the semiconductor substrate and including a first trench of a first NMOS device and a second trench of a second NMOS device, and a dielectric layer on sidewalls and a bottom of the trenches, forming an NMOS work function adjustment layer on the dielectric layer, performing a first oxidation treatment on the NMOS work function adjustment layer in the first trench to form a first oxide layer, and a second oxidation treatment on the NMOS work function adjustment layer in the second trench to form a second oxide layer, and forming a metal electrode layer in the trenches. The first oxide layer has an oxygen content lower than that of the second oxide layer.

20 Claims, 12 Drawing Sheets

(51) Int. Cl.
*H01L 29/51* (2006.01)
*H01L 29/49* (2006.01)
*H01L 21/02* (2006.01)
*H01L 21/28* (2006.01)

(52) U.S. Cl.
CPC ...... *H01L 29/517* (2013.01); *H01L 21/02244* (2013.01); *H01L 21/02252* (2013.01); *H01L 21/02255* (2013.01); *H01L 21/28088* (2013.01); *H01L 29/518* (2013.01)

(56) References Cited

U.S. PATENT DOCUMENTS

| | | | | |
|---|---|---|---|---|
| 2016/0358920 | A1* | 12/2016 | Kim | H01L 27/1116 |
| 2017/0084711 | A1* | 3/2017 | Lim | H01L 29/4966 |
| 2018/0083001 | A1* | 3/2018 | Chen | H01L 27/0886 |

* cited by examiner

SEMICONDUCTOR DEVICE HAVING MULTIPLE WORK FUNCTIONS AND MANUFACTURING METHOD THEREOF

CROSS-REFERENCES TO RELATED APPLICATIONS

The present application claims priority to Chinese patent application No. 201710158470.4, filed with the State Intellectual Property Office of People's Republic of China on Mar. 17, 2017, the content of which is incorporated herein by reference in its entirety.

FIELD OF THE INVENTION

The present disclosure relates to semiconductor technology, and more particularly to a semiconductor device having multiple work-function metal gates and manufacturing method of the same.

BACKGROUND OF THE INVENTION

With the development of integrated circuit technology, the feature size of semiconductor devices is getting smaller and smaller. Current complementary metal-oxide semiconductor (CMOS) devices use a high dielectric-constant (high-k) material as the gate dielectric layer and a metal as the gate electrode (HKMG). However, the reduction of the size of MOS semiconductor devices brings many problems.

One problem is that the use of silicon dioxide as a gate dielectric layer generates a high gate leakage current due to the tunneling effect. In the case of the same equivalent oxide thickness (EOT) a high-k (high dielectric constant) dielectric material has a physical thickness larger than that of a conventional silicon dioxide, thus, a high-k dielectric material is utilized as a gate dielectric layer to reduce the gate leakage current.

Another problem is that the depletion effect of a polysilicon gate and the finite inversion layer capacitance reduce the EOT, thereby reducing the device performance. Thus, a metal gate electrode is used instead of a polysilicon gate to reduce the depletion effect of the polysilicon gate.

In order to satisfy the needs of device designers for multiple threshold voltages, the multiple threshold voltages are implemented by using a body doping process in a conventional method. However, as the device size decreases, the adjustment of the threshold voltages by body doping can lead to degradation and fluctuation of carrier mobility. Therefore, in the case of high-k/metal gate (HKMG) processes, in order to solve the problem of degradation and fluctuation of carrier mobility, a work function adjustment layer has been proposed.

In the prior art, in order to obtain an NMOS device having three different threshold voltages, three work function adjustment layers with three different thicknesses are required. For NMOS devices with relatively high threshold voltages, the thickness of the work function adjustment layer is also relatively large. Therefore, in the case where the trench size of a metal gate is relatively small, after forming a relatively thick work function adjustment layer in the trench, it becomes difficult to deposit a metal material filling the trench to form a metal gate, and the filling effect is poor.

FIGS. 1A to 1F are cross-sectional views illustrating intermediate stages of a semiconductor device in a conventional manufacturing method as known in the prior art.

Referring to FIG. 1A, a substrate 11 is provided, and an interlayer dielectric layer 12 having three trenches is formed on substrate 11. The three trenches may be formed with a part of a gate-last process. For example, dummy gates and dummy gate oxide layers are first formed, then an interlayer dielectric layer is then formed to separate the dummy gates, and a planarization process is performed on the interlayer dielectric layer. Thereafter, the dummy gates and the dummy gate oxide layers are removed to form the three trenches.

Next, gate structures for a high threshold voltage NMOS (HVT NMOS) device, a low threshold NMOS (LVT NMOS) device, and an ultra-threshold voltage NMOS (ULVT NMOS) device are formed in the three trenches, respectively. Herein, a high threshold voltage refers to a threshold voltage higher than a standard threshold voltage, a low threshold voltage refers to a threshold voltage lower than the standard threshold voltage, and an ultra-low threshold voltage refers to a threshold voltage that is lower than the low threshold voltage. The high threshold voltage, the low threshold voltage, and the ultra-low threshold voltage may be arbitrarily referred to as the first, second, and third threshold voltages, respectively. Similarly, a high threshold voltage NMOS device, a low threshold voltage NMOS device, and an ultra-low threshold voltage NMOS device may also be arbitrarily referred to as the first, second, and third NMOS devices.

Referring to FIG. 1A, an interface layer 101 is formed at the bottom of the three trenches. Then, a high-k dielectric layer 102, a cap layer 103, a barrier layer 104, and a first PMOS work function adjustment layer 105 are sequentially formed on interface layer 101.

Next, referring to FIG. 1B, a patterned first photoresist 106 is formed on the structure exposing the trench of the LVT NMOS device. First PMOS work function adjustment layer 105 in the trench of the LVT NMOS device is then removed.

Next, referring to FIG. 1C, first photoresist 106 is removed, and a second PMOS work function adjustment layer 107 is then formed in the three trenches.

Next, referring to FIG. 1D, a patterned second photoresist 108 is formed on the structure of FIG. 1C exposing the trench of the ULVT NMOS device. Second PMOS work function adjustment layer 107 and first PMOS work function adjustment layer 105 in the trench of the ULVT NMOS device are removed.

Next, referring to FIG. 1E, second photoresist 108 is removed, a third PMOS work function adjustment layer 110 is then formed in the three trenches.

Thereafter, referring to FIG. 1F, an NMOS work function adjustment layer 111 and a metal electrode layer 112 are formed in the three trenches.

In the above-described conventional approaches, the structure of the work function adjustment layer in each device is as follows:

The structure of the work function adjustment layer of the HVT NMOS device includes first PMOS work function adjustment layer 105, second PMOS work function adjustment layer 107, third PMOS work function adjustment layer 110, and NMOS work function adjustment layer 111.

The structure of the work function adjustment layer of the LVT NMOS device includes second PMOS work function adjustment layer 107, third PMOS work function adjustment layer 110, and NMOS work function adjustment layer 111.

The structure of the work function adjustment layer of the ULVT NMOS device includes third PMOS work function adjustment layer 110, and NMOS work function adjustment layer 111.

However, for the HVT NMOS device with the highest threshold voltage, the number of layers formed in the trench is also the largest (which includes the three PMOS work function adjustment layers), resulting in a narrow trench, which causes problem in filling the trench, so that the filling effect of the trench is poor. For example, when NMOS work function adjustment layer 111 and metal electrode layer 112 are formed in the trench, since the air gap (space) in the trench is small, the trench may not be completely filled so that voids are formed in the trench, thereby affecting the performance of the device.

BRIEF SUMMARY OF THE INVENTION

In view of the above problems, embodiments of the present invention provide novel semiconductor structures and manufacturing methods thereof for improving the trench filling effect.

According to some embodiments of the present invention, a method of manufacturing a semiconductor device may include:

(a) providing a substrate structure including a semiconductor substrate, an interlayer dielectric layer on the semiconductor substrate, a plurality of trenches extending through the interlayer dielectric layer to the semiconductor substrate and including a first trench of a first NMOS device and a second trench of a second NMOS device, and a dielectric layer on sidewalls and a bottom of the trenches on the semiconductor substrate;

(b) forming an NMOS work function adjustment layer on the dielectric layer in the trenches;

(c) performing a first oxidation treatment on the NMOS work function adjustment layer in the first trench to form a first oxide layer; and performing a second oxidation treatment on the NMOS work function adjustment layer in the second trench to form a second oxide layer. The first oxide layer has an oxygen content lower than an oxygen content of the second oxide layer.

(d) forming a metal electrode layer on the NMOS work function adjustment layer in the trenches after performing the first and second oxidation treatments.

In one embodiment, performing the first oxidation treatment in step (c) includes: (c1) forming a patterned first mask in the second trench while exposing the first trench; (c2) performing the first oxidation treatment using the patterned first mask as a mask; (c3) removing the patterned first mask; and the method further comprising, after performing the first oxidation treatment: (c4) forming a patterned second mask in the first trench while exposing the second trench; (c5) performing the second oxidation treatment using the patterned second mask as a mask; and (c6) removing the patterned second mask.

In one embodiment, the plurality of trenches further include a third trench of a third NMOS device. Performing the first oxidation treatment includes (c1) forming a patterned first mask in the second trench and the third trench while exposing the first trench; (c2) performing the first oxidation treatment using the patterned first mask as a mask; (c3) removing the patterned first mask. The method further comprising, after performing the first oxidation treatment: (c4) forming a patterned second mask in the first trench and the third trench while exposing the second trench; (c5) performing the second oxidation treatment using the patterned second mask as a mask; and (c6) removing the patterned second mask.

In one embodiment, each of the processes of performing the first oxidation treatment and the second oxidation treatment includes performing an annealing in an environment containing oxygen, or performing a plasma oxidation treatment.

In one embodiment, the dielectric layer includes a high-k dielectric layer. The method further includes forming an interface layer on the bottom of the trenches on the semiconductor substrate, and the dielectric layer is formed on the interface layer and on the sidewalls of the trenches.

In one embodiment, the method further includes forming a cap layer on the dielectric layer, and forming a barrier layer on the cap layer; wherein the NMOS work function adjustment layer is on the barrier layer.

In one embodiment, the NMOS work function adjustment layer includes TaC, Ti, Al, or $Ti_xAl_{1-x}$, where $0<x<1$. The interface layer includes oxide or nitrogen oxide. The high-k dielectric layer includes La2O3, TiO2, Ta2O5, ZrO2, BaZrO, HfO2, HfZrO, HfZrON, HfLaO, HfSiO, HfSiON, LaSiO, AlSiO, HfTaO, HfTiO, (Ba, Sr) TiO3, Al2O3, Si3N4, or nitrogen oxide. The cap layer includes $Ti_xN_{1-x}$, where $0<x<1$. The barrier layer includes TaN.

Some embodiments of the present invention also provide a method of manufacturing a semiconductor device. The method may include:

(a) providing a substrate structure including a semiconductor substrate, an interlayer dielectric layer on the semiconductor substrate, a plurality of trenches extending through the interlayer dielectric layer to the semiconductor substrate and including a first trench of a first NMOS device and a second trench of a second NMOS device, and a dielectric layer on sidewalls and a bottom of the trenches on the semiconductor substrate;

(b) forming an NMOS work function adjustment layer on the dielectric layer in the trenches;

(c) performing an oxidation treatment on the NMOS work function adjustment layer in the first trench to form an oxide layer; and (d) forming a metal electrode layer on the NMOS work function adjustment layer in the trenches after performing the oxidation treatment.

In one embodiment, performing the oxidation treatment includes: (c1) forming a patterned mask in the second trench while exposing the first trench; (c2) performing the oxidation treatment using the patterned mask as a mask; and (c3) removing the patterned mask.

In one embodiment, performing the oxidation treatment includes: performing an annealing in an environment containing oxygen; or performing a plasma oxidation treatment.

In one embodiment, the method further includes forming an interface layer on the bottom of the trenches on the semiconductor substrate; and the dielectric layer is formed on the interface layer and on the sidewalls of the trenches. In one embodiment, the dielectric layer includes a high-k dielectric layer.

In one embodiment, the method further includes forming a cap layer on the dielectric layer, and forming a barrier layer on the cap layer; wherein the NMOS work function adjustment layer is on the barrier layer.

Embodiments of the present invention also provide a semiconductor device. The semiconductor device includes a semiconductor substrate, an interlayer dielectric layer on the semiconductor substrate, a plurality of trenches extending through the interlayer dielectric layer to the semiconductor substrate and comprising a first trench of a first NMOS device and a second trench of a second NMOS device, a dielectric layer on a bottom and sidewalls of the trenches, an NMOS work function adjustment layer comprising a first oxide layer on the dielectric layer in the first trench and a second oxide layer on the dielectric layer in the second trench, and a metal electrode layer on the NMOS work function adjustment layer. The first oxide layer has an oxygen content lower than an oxygen content of the second oxide layer.

In one embodiment, the plurality of trenches further include a third trench of a third NMOS device.

In one embodiment, the semiconductor device further includes an interface layer on the bottom of the trenches on the semiconductor substrate. The dielectric layer is disposed on the interface layer and on the sidewalls of the trenches. In one embodiment, the dielectric layer includes a high-k dielectric layer.

In one embodiment, the semiconductor device further includes a cap layer on the dielectric layer, and a barrier layer on the cap layer. The NMOS work function adjustment layer is on the barrier layer.

Some embodiments of the present invention also provide a semiconductor device. The semiconductor device includes a semiconductor substrate, an interlayer dielectric layer on the semiconductor substrate, a plurality of trenches extending through the interlayer dielectric layer to the semiconductor substrate and comprising a first trench of a first NMOS device and a second trench of a second NMOS device, a dielectric layer on a bottom and sidewalls of the trenches, an NMOS work function adjustment layer comprising a first oxide layer on the dielectric layer in the first trench, and a metal electrode layer on the NMOS work function adjustment layer in the trenches.

In one embodiment, the semiconductor device further includes an interface layer on the bottom of the trenches on the semiconductor substrate. The dielectric layer is disposed on the interface layer and on the sidewalls of the trenches, and the dielectric layer includes a high-k dielectric layer.

In one embodiment, the semiconductor device further includes a cap layer on the dielectric layer, and a barrier layer on the cap layer; wherein the NMOS work function adjustment layer is on the barrier layer.

The following detailed description together with the accompanying drawings will provide a better understanding of the nature and advantages of the present invention.

BRIEF DESCRIPTION OF THE DRAWINGS

Embodiments of the present invention are described with reference to the accompanying drawings. In the drawings, like reference numbers may indicate identical or functionally similar elements.

DETAILED DESCRIPTION OF THE INVENTION

Figure 1A:
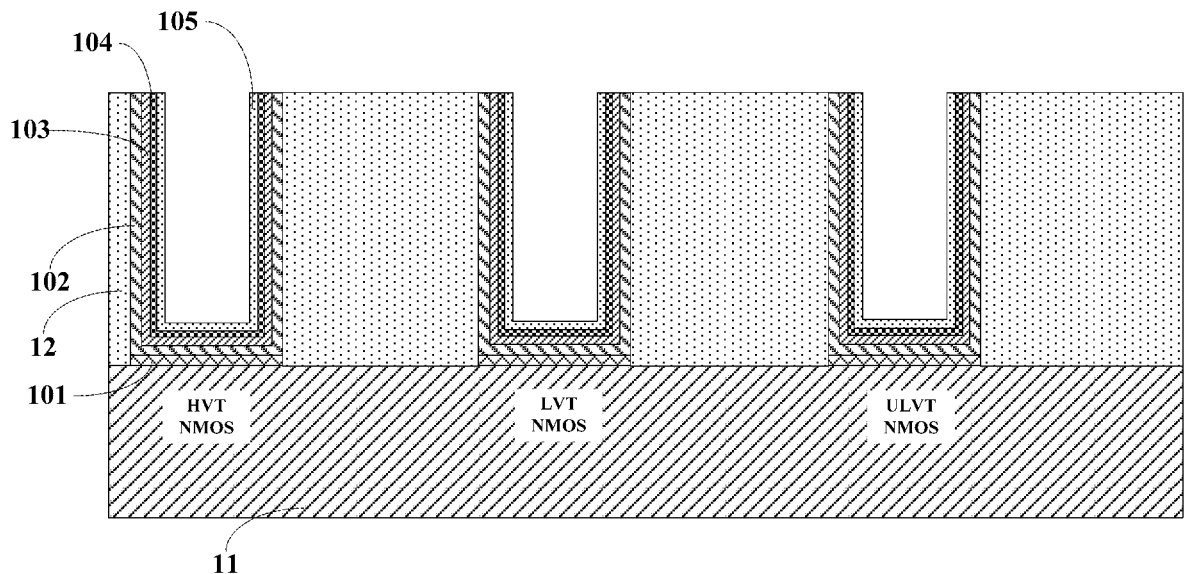
FIGS. 1A to 1F are cross-sectional views illustrating intermediate stages of a semiconductor device in a conventional manufacturing method as known in the prior art.
Figure 1B:
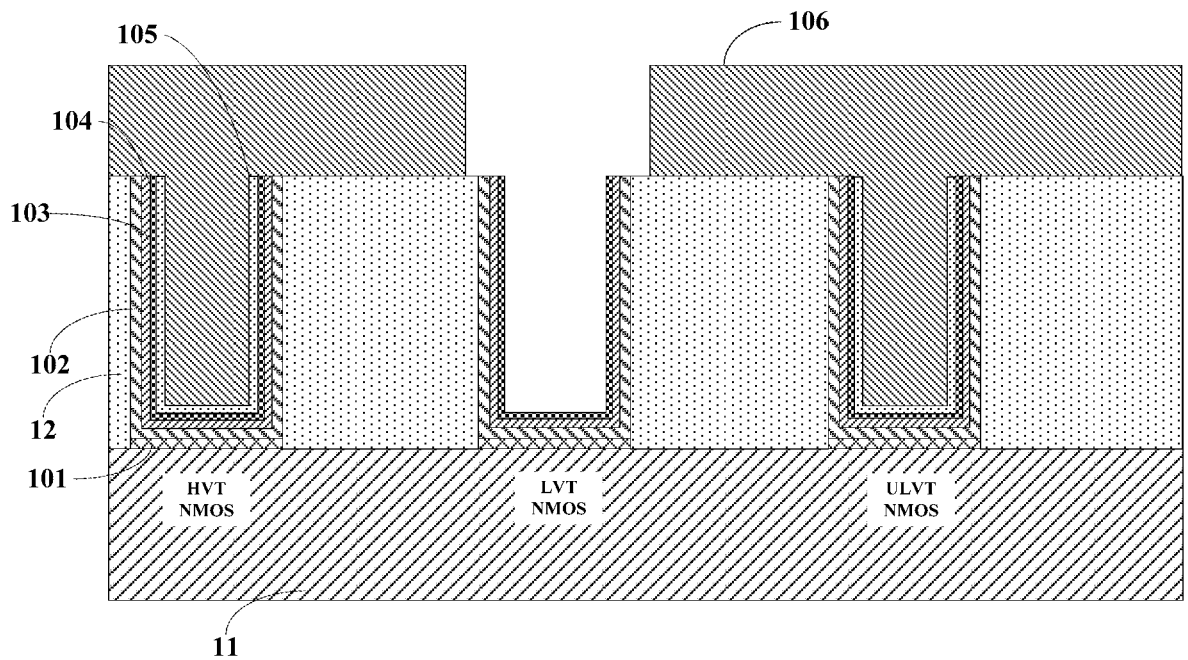
Figure 1C:
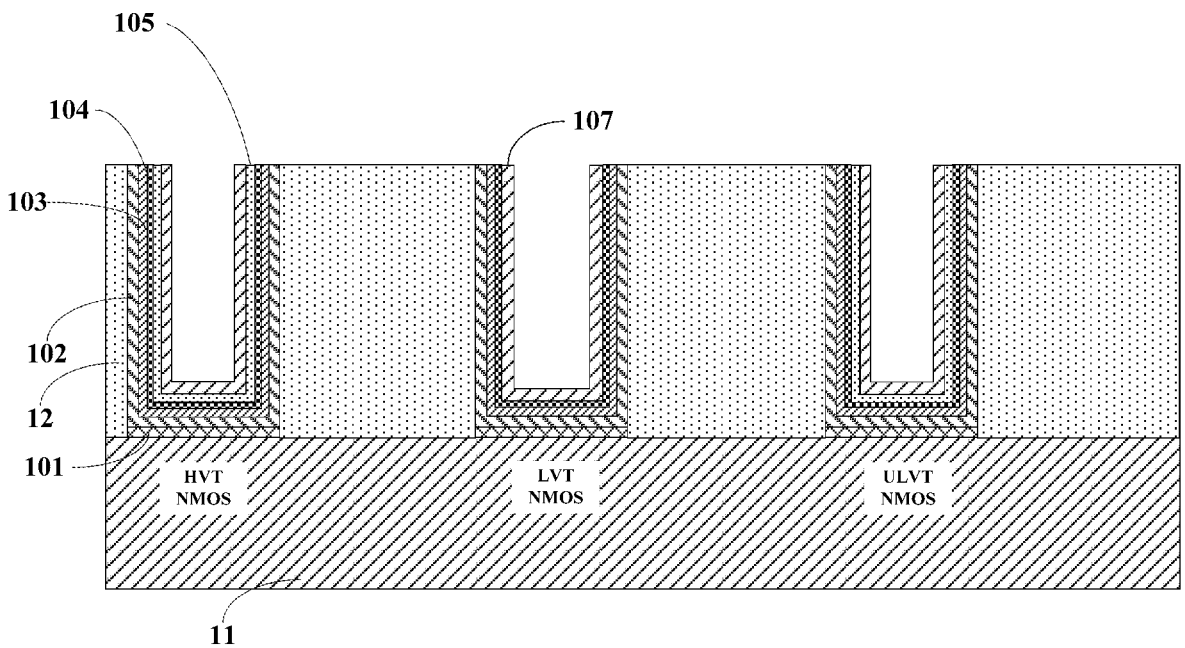
Figure 1D:
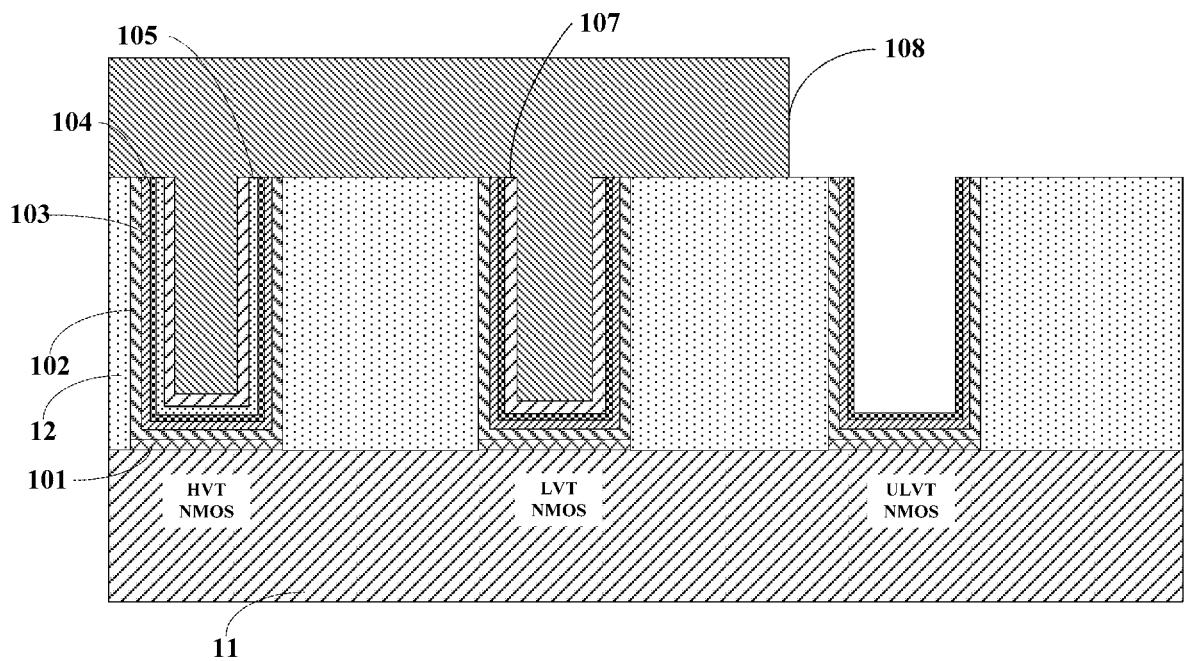
Figure 1E:
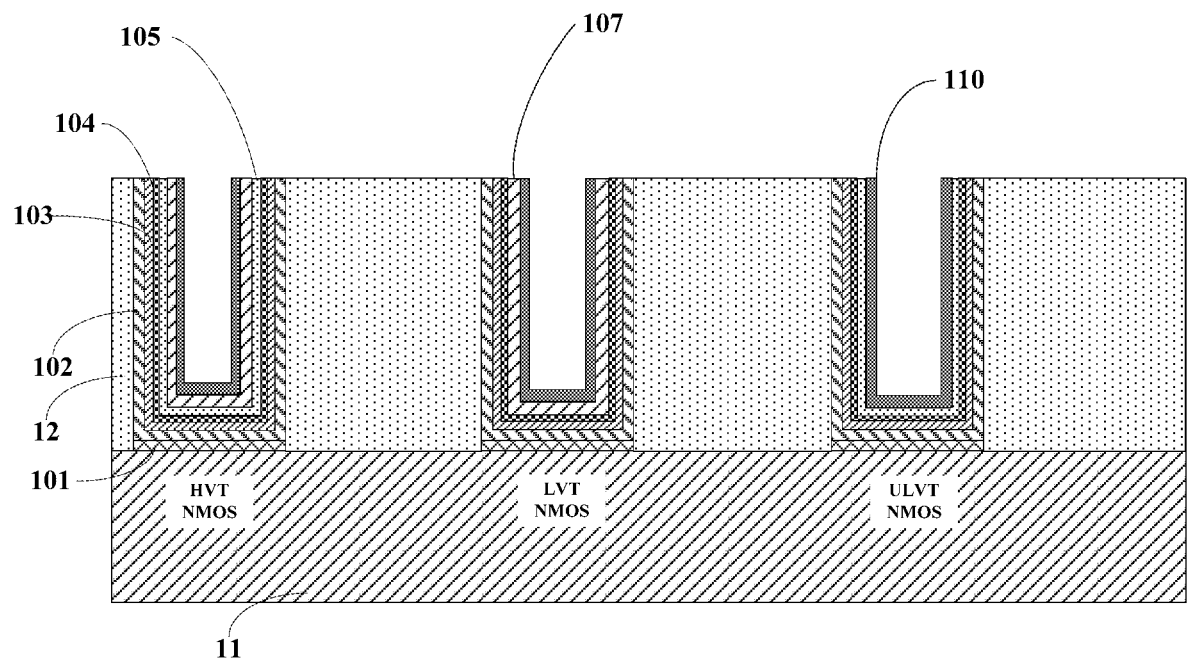
Figure 1F:
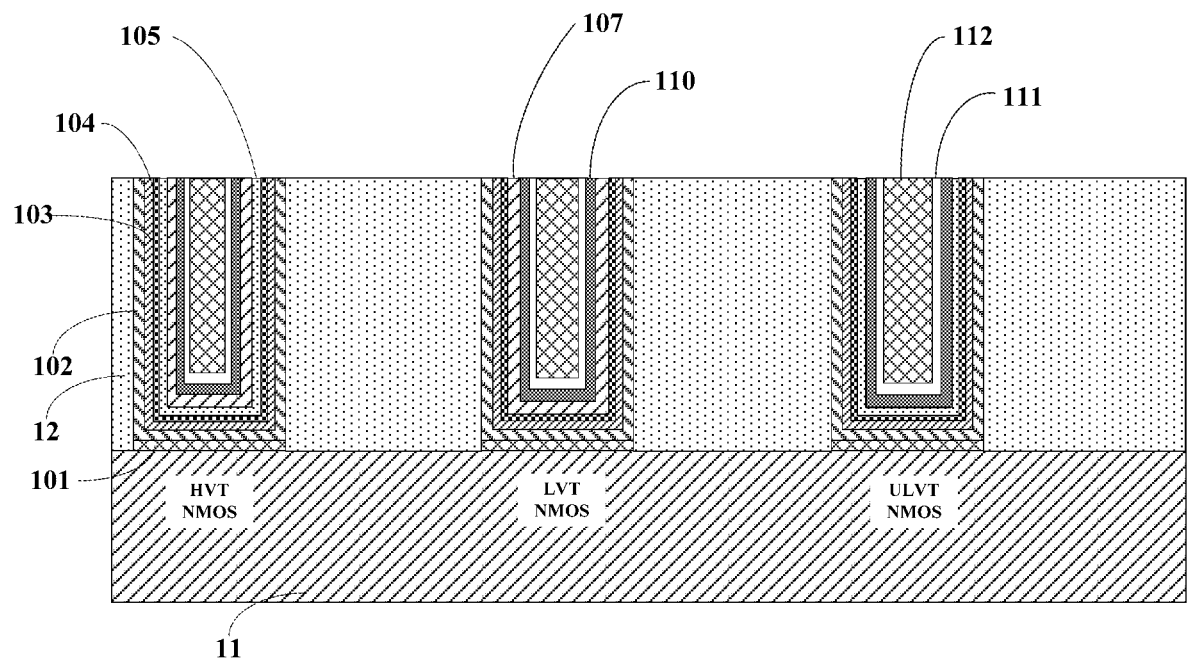

Embodiments of the present invention now will be described more fully hereinafter with reference to the accompanying drawings. The invention may, however, be embodied in many different forms and should not be construed as limited to the embodiments set forth herein. Rather, these embodiments are provided so that this disclosure will be thorough and complete, and will fully convey the scope of the invention to those skilled in the art. The features may not be drawn to scale, some details may be exaggerated relative to other elements for clarity bike numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an", and "the" are intended to include the plural forms as well, unless the context dearly indicates otherwise. It will be further understood that the terms "comprises", "comprising", "includes", and/or "including" when used herein, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-sectional illustrations that are schematic illustrations of idealized embodiments (and intermediate structures) of the invention. The thickness of layers and regions in the drawings may be enlarged relative to other layers and regions for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The embodiments described and references in the disclosure to "one embodiment," "an embodiment," "an exemplary embodiment" indicate that the embodiments described may include a particular feature, structure, or characteristic. However, every embodiment may not necessary include the particular feature, structure or characteristic. As used throughout this disclosure, the terms "depositing" and "forming" are used interchangeably. The terms "metal material" and "metallic material" are used interchangeably.

Embodiments of the present invention now will be described more fully hereinafter with reference to the accompanying drawings, in which embodiments of the invention are shown. This invention may, however, be embodied in many different forms and should not be construed as limited to the embodiments set forth herein.

Figure 2:
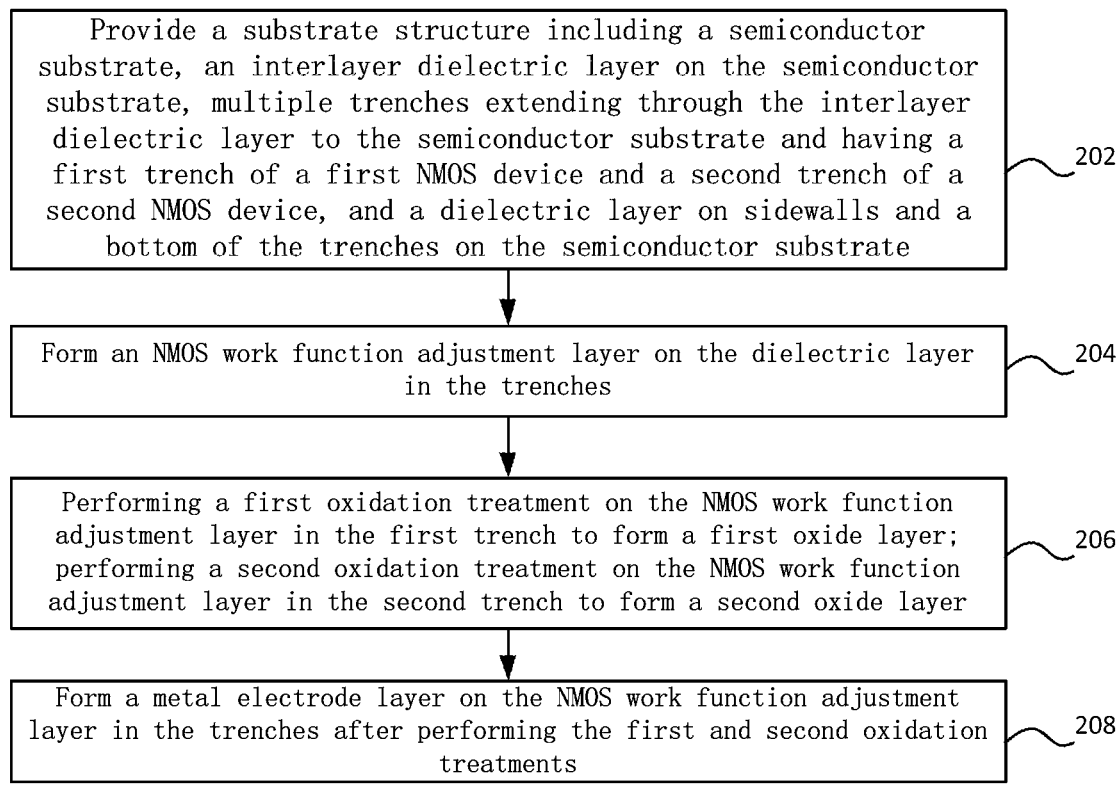
FIG. 2 is a simplified flowchart illustrating a method of manufacturing a semiconductor device according to an embodiment of the present invention.

FIG. 2 is a simplified flowchart illustrating a method of manufacturing a semiconductor device according to an embodiment of the present invention. FIGS. 3A to 3F are cross-sectional views illustrating intermediate stages of a semiconductor device in the manufacturing method according to an embodiment of the present invention.

A manufacturing method of a semiconductor device according to an embodiment of the present invention will be described in detail with reference to FIG. 2 and FIGS. 3A to 3F.

Referring to FIG. 2, a substrate structure is provided in step 202.

Figure 3A:
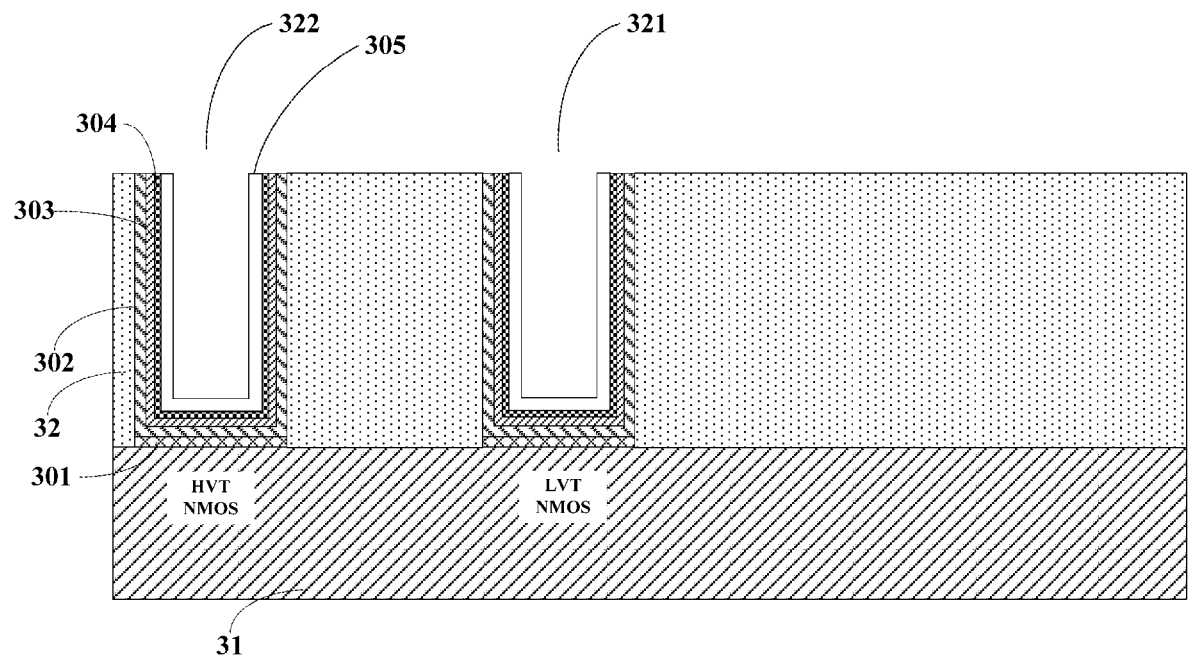
FIGS. 3A to 3F are cross-sectional views illustrating intermediate stages of a semiconductor device in the manufacturing method according to an embodiment of the present invention.

FIG. 3A is a cross-sectional view illustrating a substrate structure in the manufacturing method according to an embodiment of the present invention. Referring to FIG. 3A, the substrate structure includes a semiconductor substrate (e.g., a silicon substrate) 31, an interlayer dielectric layer 32 on semiconductor substrate 31, a plurality of trenches extending through interlayer dielectric layer 32 to semiconductor substrate 31. In the embodiment, the plurality of trenches include a first trench 321 for a first NMOS device (e.g., an LVT NMOS device) and a second trench 322 for a second NMOS device (e.g., an HVT NMOS device). The substrate structure also includes a dielectric layer 302 disposed on the surface of semiconductor substrate 31 at the bottom of the trenches and sidewalls of the trenches.

In one embodiment, dielectric layer 302 may include a high-k dielectric layer. In one embodiment, the high-k dielectric layer may include, but not limited to, one or more of the following materials: $La_2O_3$, $TiO_2$, $Ta_2O_5$, $ZrO_2$, $BaZrO$, $HfO_2$, $HfZrO$, $HfZrON$, $HfLaO$, $HfSiO$, $HfSiON$, $LaSiO$, $AlSiO$, $HfTaO$, $HfTiO$, $(Ba, Sr)TiO_3$, $Al_2O_3$, $Si_3N_4$, or nitrogen oxide. Dielectric layer 302 may be formed using a chemical vapor deposition (CVD), an atomic layer deposition (ALD), or physical vapor deposition (PVD) process. Dielectric layer 302 has a thickness in the range between 10 angstroms and 40 angstroms, e.g., 20 angstroms, 30 angstroms.

In one embodiment, an interface layer 301 may be formed on the surface of semiconductor substrate 21 at the bottom of the trenches, dielectric layer 302 is disposed on interface layer 301 and sidewalls of the trenches. Interface layer 301 may be an oxide or a nitrogen oxide. Interface layer 301 may be formed by thermal oxidation or by deposition such as CVD, ALD, or PVD. The thickness of interface layer 301 is in the range between 5 angstroms and 15 angstroms, e.g., 10 angstroms, 13 angstroms.

In one embodiment, a cap layer 303 and a barrier layer 304 are sequentially formed on dielectric layer 302 in the trenches. For example, cap layer 303 and barrier layer 304 may be formed by CVD, ALD, or PVD. In one embodiment, cap layer 303 may include, but not limited to, $Ti_xN_{1-x}$, where $0<x<1$. Cap layer 303 has a thickness in the range of 0 (zero) angstrom (i.e., cap layer 303 is omitted) and 30 angstroms, i.e., 10 angstroms, 20 angstroms. Cap layer 303 may block the diffusion of metal elements (e.g., Al) into the high-k dielectric layer in the subsequent formation of an NMOS work function adjustment layer to not affect the device stability and other performance parameters. In one embodiment, barrier layer 304 may include, but not limited to, TaN, and has a thickness in the range of 0 (zero) angstrom (i.e., barrier layer 303 is omitted) and 30 angstroms, i.e., 10 angstroms, 20 angstroms. Barrier layer 304 may serve as an etch stop layer for a subsequent etching on the NMOS work function adjustment layer.

Referring back to FIG. 2, in step 204, an NMOS work function adjustment layer 305 is formed on dielectric layer 302 in the trenches, as shown in FIG. 3A. For example, NMOS work function adjustment layer 305 may be formed by CVD, ALD, or PVD. It is to be noted that, in the case where the substrate structure includes barrier layer 304, NMOS work function adjustment layer 305 is formed on barrier layer 304. In one embodiment, NMOS work function adjustment layer 305 may include, but is not limited to, TaC, Ti, Al, TiAl, or $Ti_xAl_{1-x}$ ($0<x<1$) and has a thickness in the range between 10 angstroms and 100 angstroms, e.g., 30 angstroms, 50 angstroms, 80 angstroms, etc.

Next, in step 206, a first oxidation treatment is performed on the surface of NMOS work function adjustment layer 305 in first trench 321 to form a first oxide layer 315, and a second oxidation treatment is performed on the surface of NMOS work function adjustment layer 305 in second trench 322 to form a second oxide layer 325.

An embodiment of step 206 will now be described in detail below with reference to FIGS. 3B to 3E.

Figure 3B:
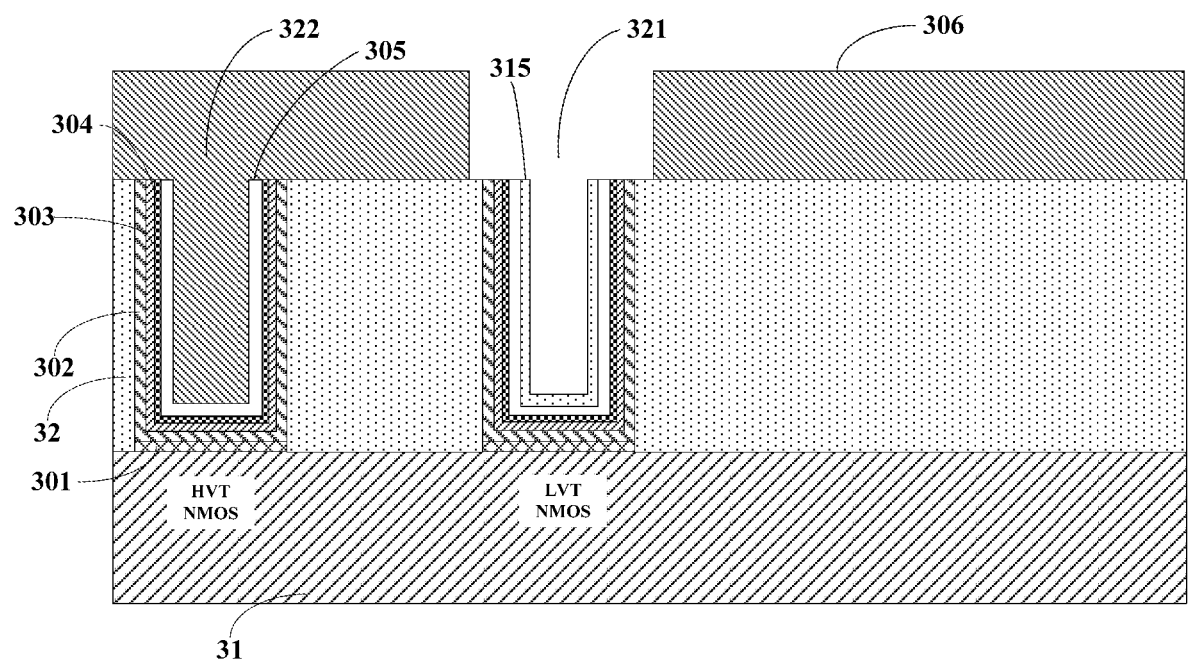

Referring to FIG. 3B, a patterned first mask 306 (e.g., photoresist) is formed in second trench 322 exposing first trench 321. A first oxidation treatment is then performed using first mask 306 as a mask to form a first oxide layer 315 in first trench 321.

In one embodiment, the first oxidation treatment may be carried out in an environment containing oxygen (e.g., an environment including oxygen, nitrogen, and other gases). The oxygen content in first oxide layer 315 may be controlled by adjusting the annealing time and/or the ratio of oxygen in the environment.

In another embodiment, the first oxidation treatment may include a plasma oxidation treatment. The oxygen content in first oxide layer 315 may be controlled by adjusting the dose and/or implantation energy of oxygen.

Figure 3C:
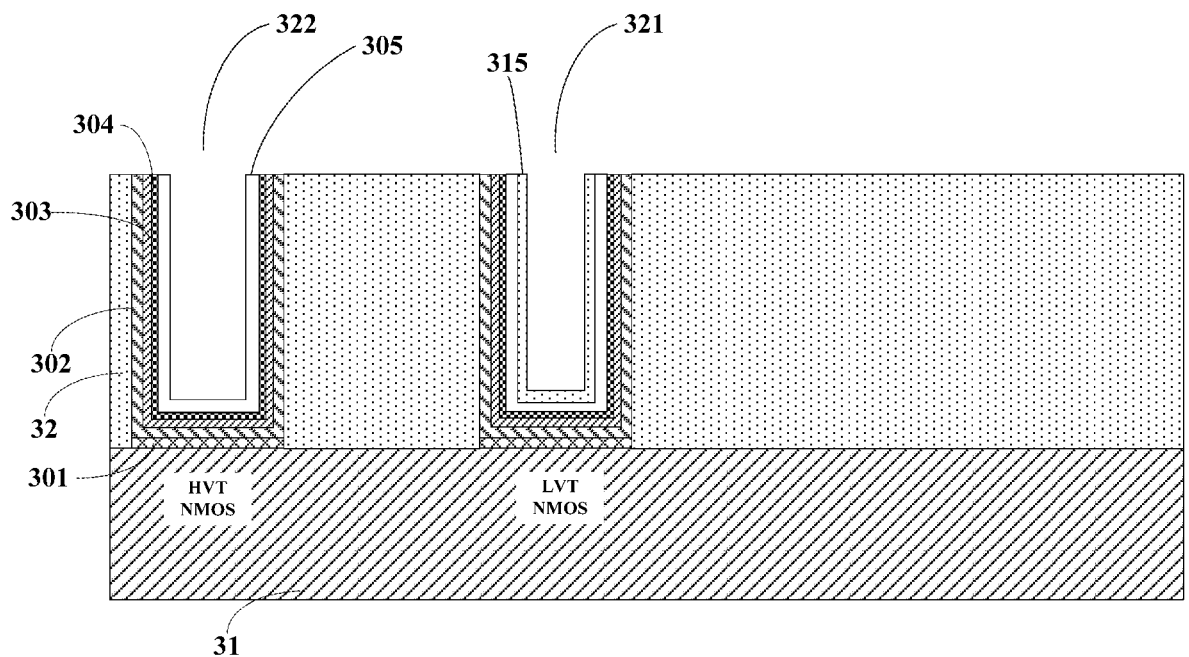

Referring to FIG. 3C, first mask 306 is removed.

Figure 3D:
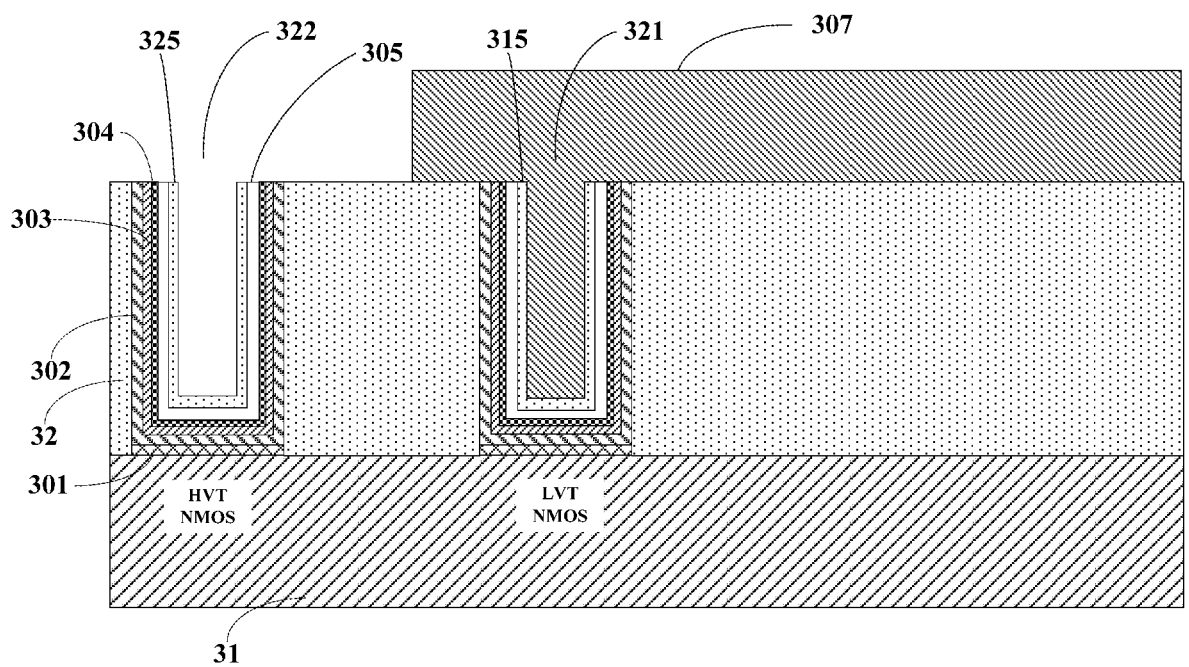

Referring to FIG. 3D, a patterned second mask 307 (e.g., photoresist) is formed in first trench 321 exposing second trench 322. A second oxidation treatment is then performed using second mask 307 as a mask to form a second oxide layer 325 in second trench 322.

Similarly, the second oxidation treatment may be carried out in an environment containing oxygen (e.g., an environment including oxygen, nitrogen, and other gases). The oxygen content in second oxide layer 325 may be controlled by adjusting the annealing time and/or the ratio of oxygen in the environment. Alternatively, the second oxidation treatment may include a plasma oxidation treatment. The oxygen content in second oxide layer 325 may be controlled by adjusting the dose and/or implantation energy of oxygen.

In one embodiment, the oxygen content in first oxide layer 315 is lower than the oxygen content in second oxide layer 325.

Figure 3E:
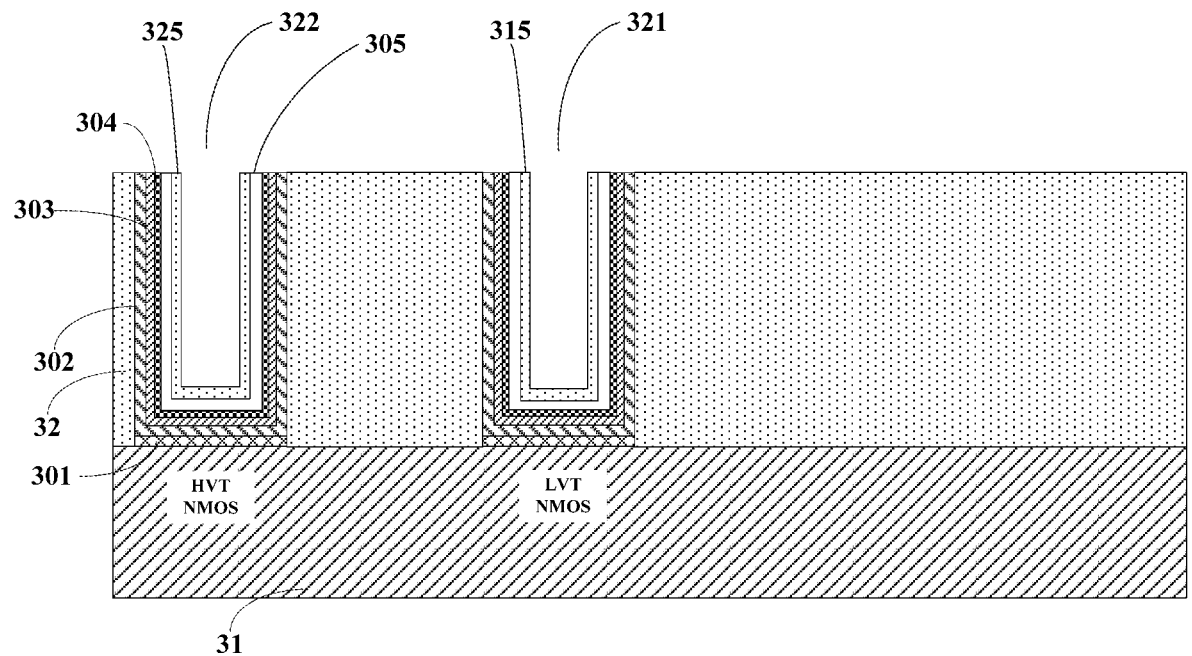

Referring to FIG. 3E, second mask 307 is removed.

It is to be understood that, although FIGS. 3B to 3E illustrate first oxide layer 315 having a lower oxygen content is formed before forming second oxide layer 325 having a higher oxygen content to described step 206, the described embodiment is only exemplary and should not be considered as limiting the scope of the invention. In another embodiment, second oxide layer 325 having a higher oxygen content may be first formed, thereafter first oxide layer 315 having a lower oxygen content may then be formed.

Figure 3F:
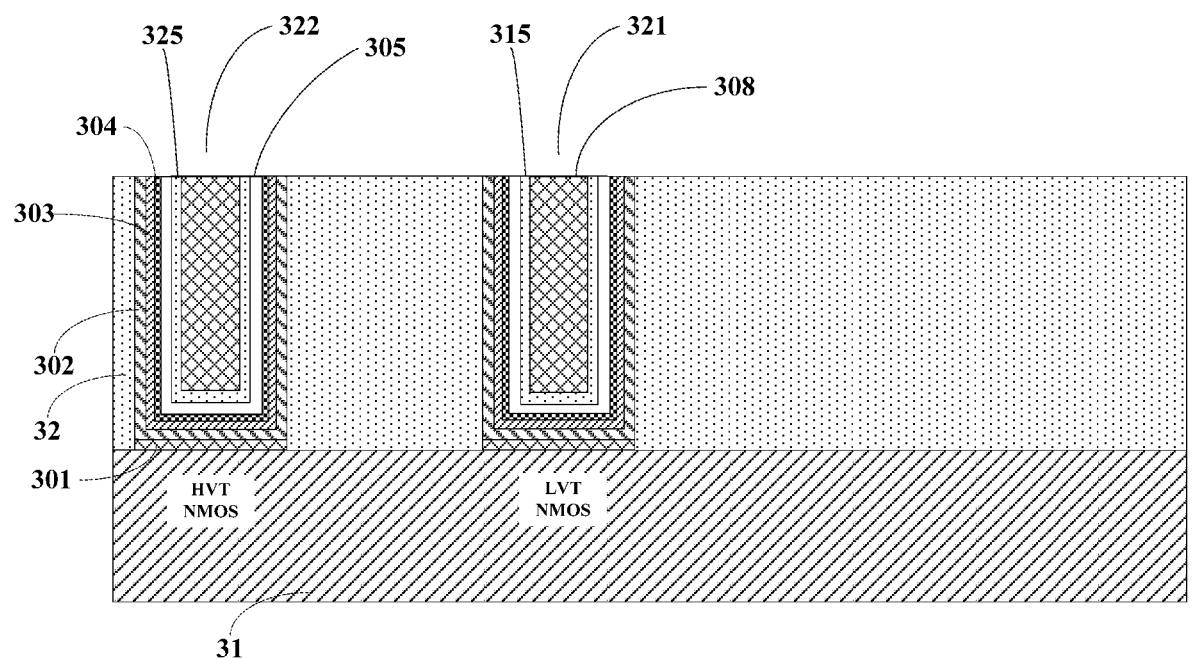

Next, in step 208, referring to FIG. 3F, a metal electrode layer 308 is formed on first oxide layer 315 and second oxide layer 325 in the trenches (trenches 321, 322, respectively). For example, metal electrode layer 308 may be formed by CVD, ALD, or PVD. Metal electrode layer 308 may include, but not limited to, tungsten, aluminum, or the like.

The above-described embodiment thus provides a method of manufacturing a semiconductor device. In the embodiment, the surfaces of the NMOS work function adjustment layers in different NMOS devices are subjected to separate oxidation treatments to obtain oxide layers each having a different oxygen content, such that the NMOS devices have different threshold voltages. Compared with the prior art, the embodiment according to the present invention does not utilize a PMOS work function adjustment layer, the NMOS devices can have different threshold voltages by adjusting the amount of oxidation in the oxide layers on the surface of the NMOS work function adjustment layer. For an NMOS device having a high threshold voltage, it is not necessary to form multiple PMOS work function adjustment layers in the trench, so that the filling effect of the trench is improved, e.g., the air gap (space) of the trench for the metal electrode layer can be made larger.

FIGS. 4A to 4F are cross-sectional views illustrating intermediate stages of a semiconductor device in the manufacturing method according to another embodiment of the present invention. The embodiment shown in FIGS. 4A to 4F includes a third trench for a third NMOS device as compared to the embodiment shown in FIGS. 3A to 3F. Hereinafter, only the difference between the method of the present embodiment and the embodiments shown in FIGS. 3A to 3F will be described, similar NMOS devices having similar or same reference numerals will be referred back to the description associated with FIGS. 3A to 3F.

Figure 4A:
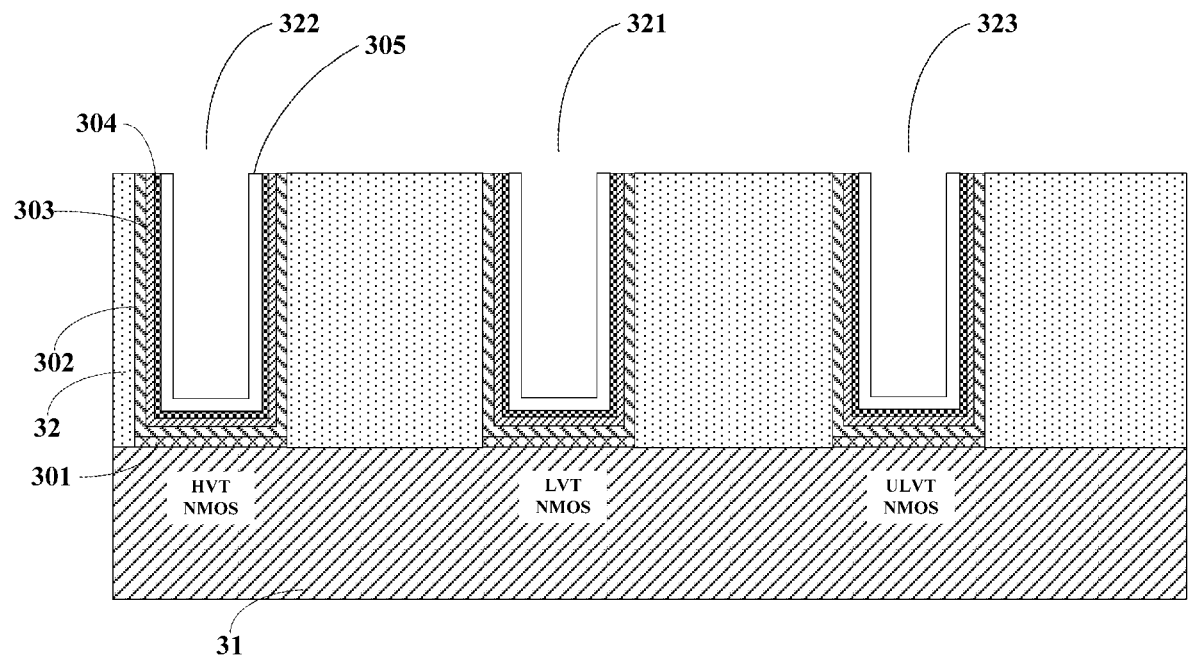
FIGS. 4A to 4F are cross-sectional views illustrating intermediate stages of a semiconductor device in the manufacturing method according to another embodiment of the present invention.

Referring to FIG. 4A, a substrate structure is provided. The substrate structure includes a semiconductor substrate 31, and an interlayer dielectric layer 32 on semiconductor substrate 31. Interlayer dielectric layer 32 includes plurality of trenches extending through the dielectric layer to the semiconductor substrate. A dielectric layer 302 is disposed on the surface of semiconductor substrate 31 at the bottom of the trenches and sidewalls of the trenches, and an NMOS work function adjustment layer 305 on dielectric layer 302.

Referring to FIG. 4A, the trenches include a first trench 321 for a first NMOS device (e.g., an LVT NMOS device) and a second trench 322 for a second NMOS device (e.g., an HVT NMOS device), and a third trench 323 for a third NMOS device (e.g., an ULVT NMOS device).

Figure 4B:
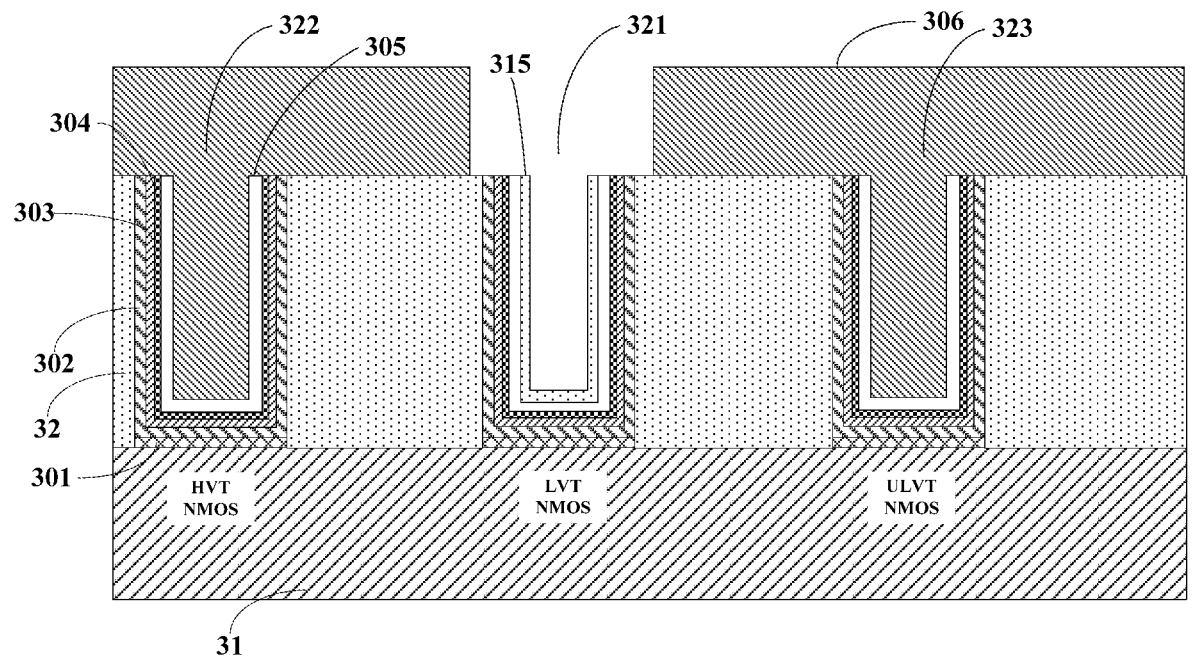

Next, referring to FIG. 4B, a patterned first mask 306 (e.g., photoresist) is formed in second trench 322 and third trench 323 while exposing first trench 321. NMOS work function adjustment layer 305 in first trench 321 is then subjected to a first oxidation process using first mask 306 as a mask to form a first oxide layer 315.

Figure 4C:
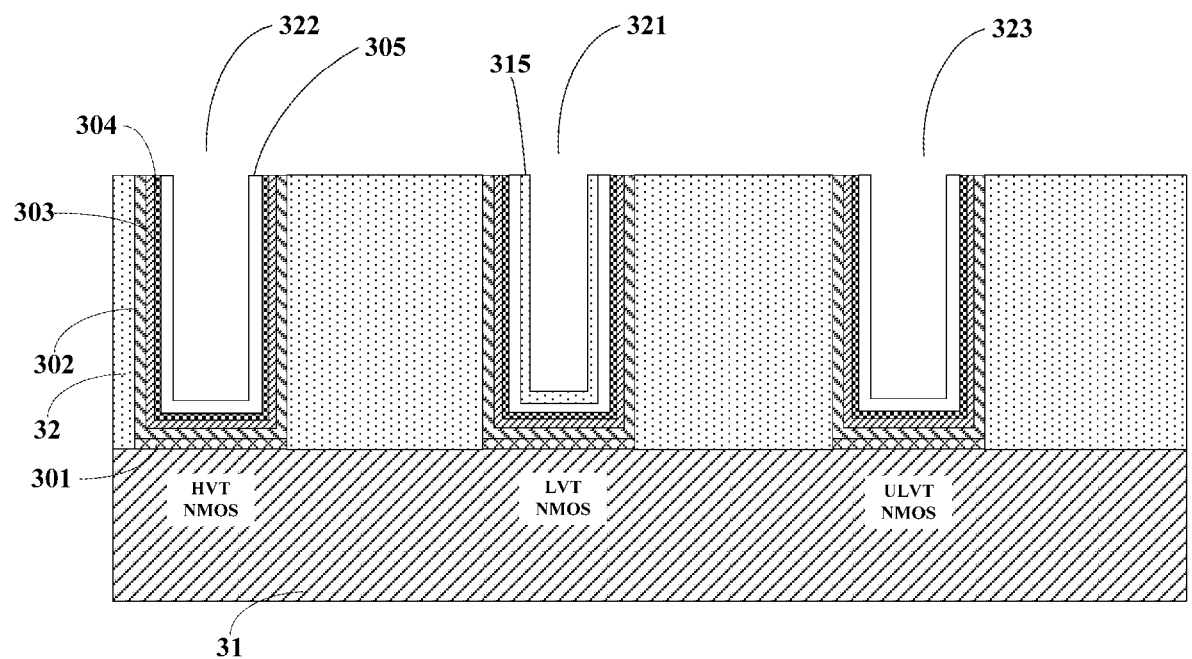

Thereafter, first mask 306 is removed, as shown in FIG. 4C.

Figure 4D:
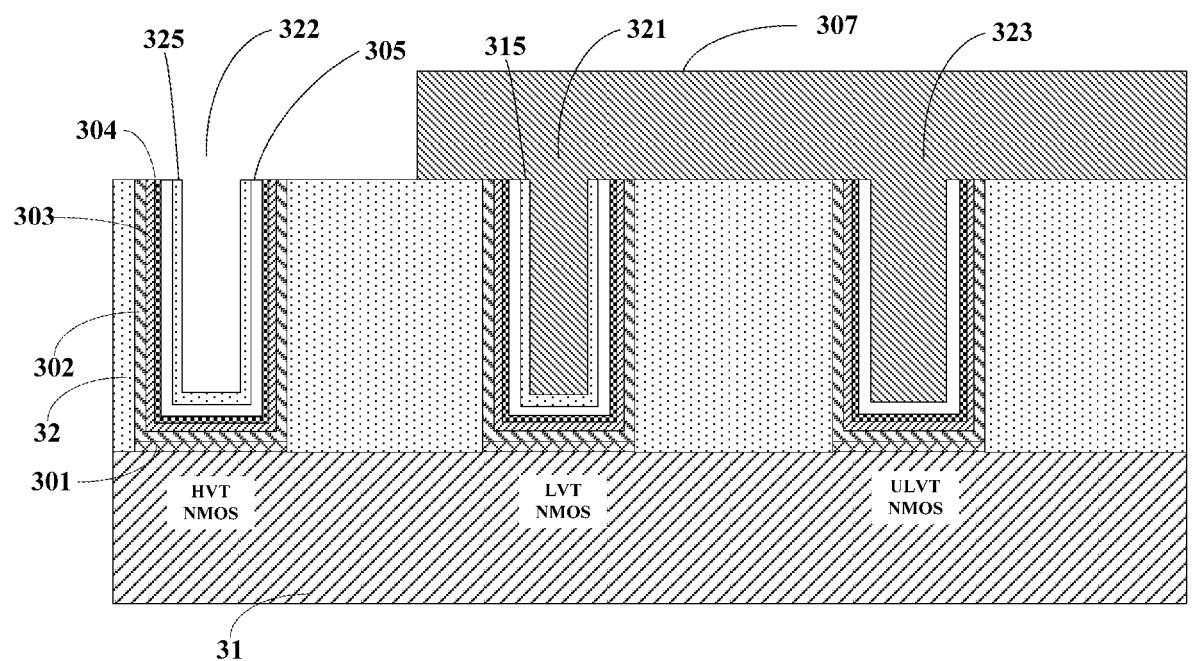

Next, referring to FIG. 4D, a patterned second mask 307 (e.g., photoresist) is formed in first trench 321 and third trench 323 while exposing second trench 322. NMOS work function adjustment layer 305 in second trench 322 is then subjected to a second oxidation process using second mask 307 as a mask to form a second oxide layer 325.

Figure 4E:
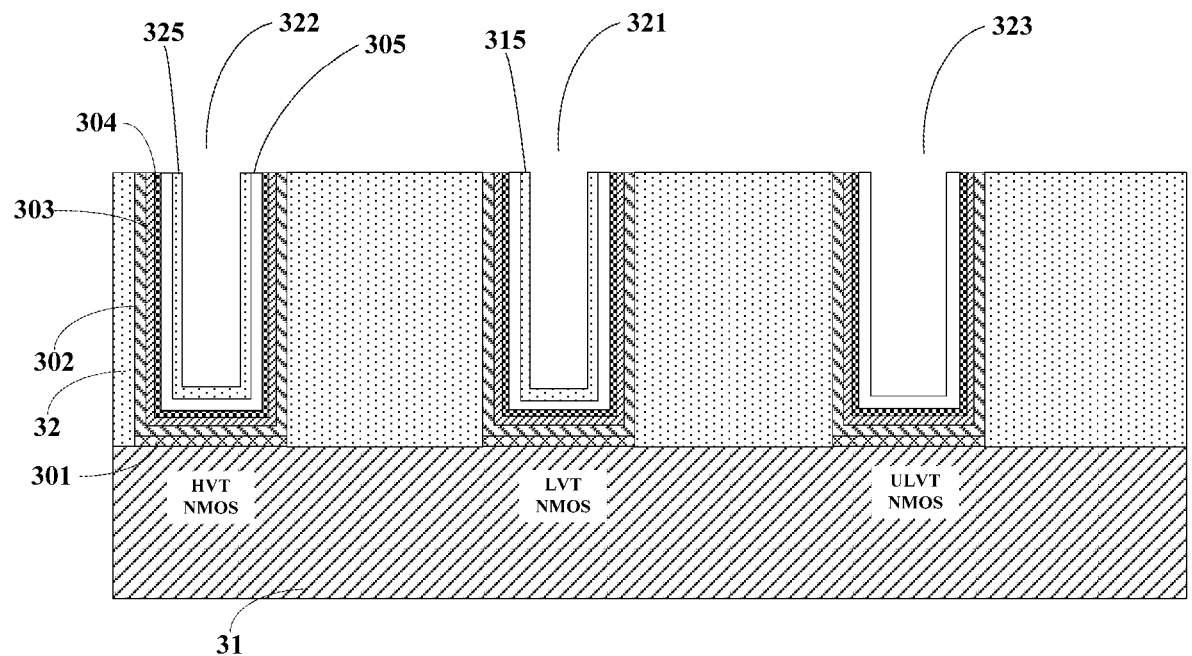

Thereafter, second mask 307 is removed, as shown in FIG. 4E.

Figure 4F:
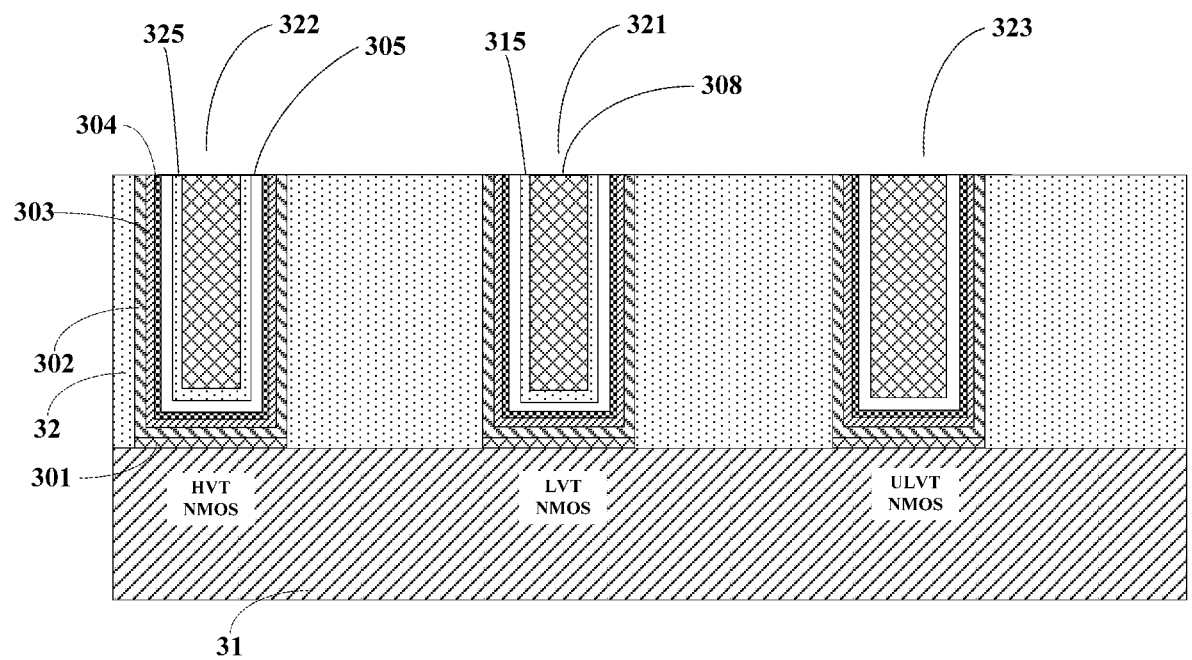

Next, referring to FIG. 4F, a metal electrode layer 308 is formed on the NMOS work function adjustment layer in the trenches (first, second and third trenches). Metal electrode layer 308 may include, but not limited to, tungsten, aluminum, or the like.

The embodiment shown in FIGS. 4A to 4F describes another method of manufacturing a semiconductor device. In the embodiment, three NMOS devices having three different threshold voltages can be formed. The oxygen content in the oxide layer on the surface of the NMOS work function adjustment layer 305 in the NMOS device having the highest threshold voltage is the highest, and the surface of the NMOS work function adjustment layer 305 in the NMOS device having the lowest threshold voltage is not oxidized.

Figure 5:
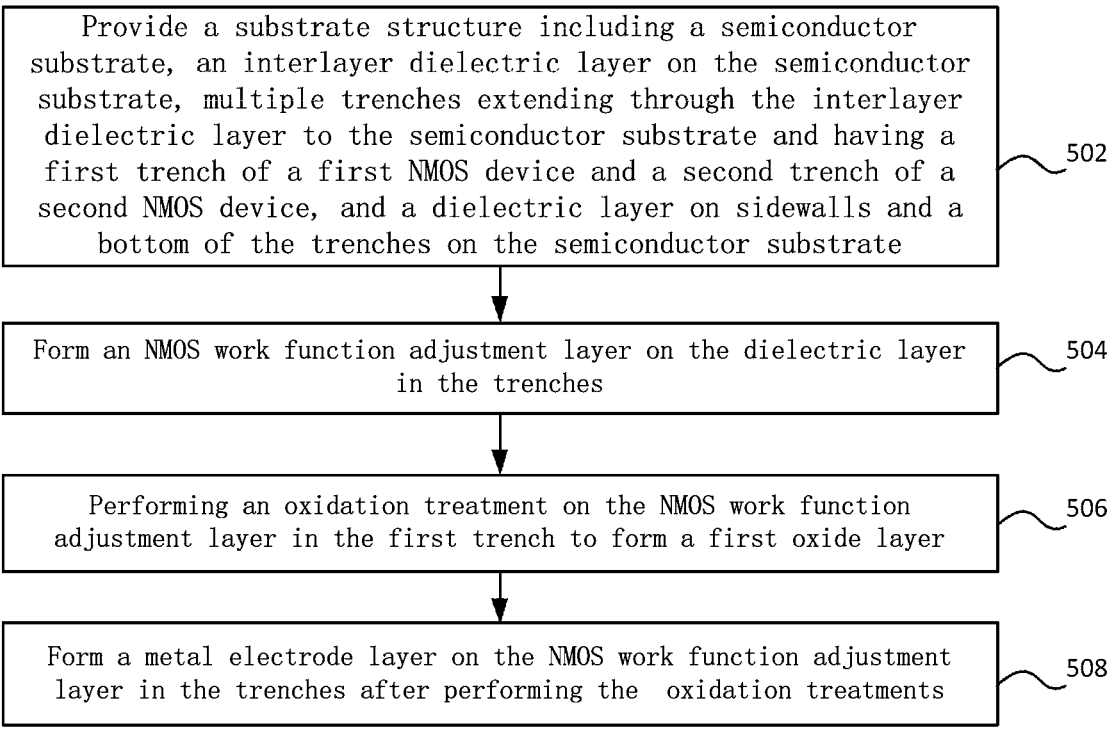
FIG. 5 is a simplified flowchart illustrating a method of manufacturing a semiconductor device according to another embodiment of the present invention.
Figure 6A:
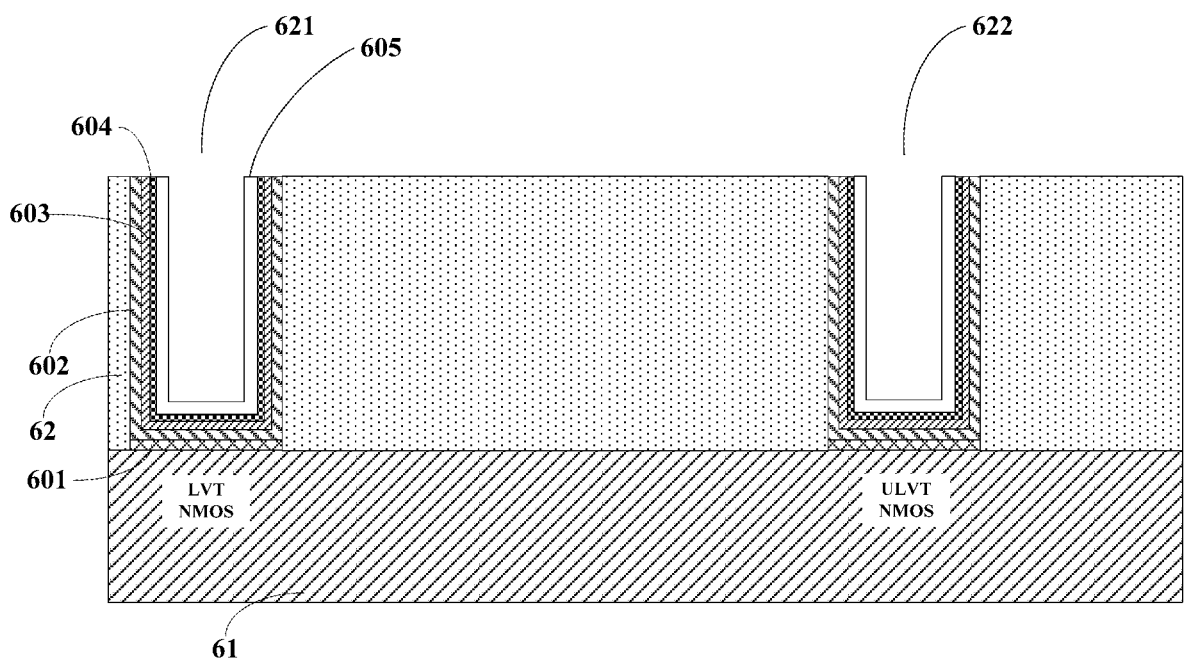
FIGS. 6A to 6C are cross-sectional views illustrating intermediate stages of a semiconductor device in the manufacturing method according to another embodiment of the present invention.
Figure 6B:
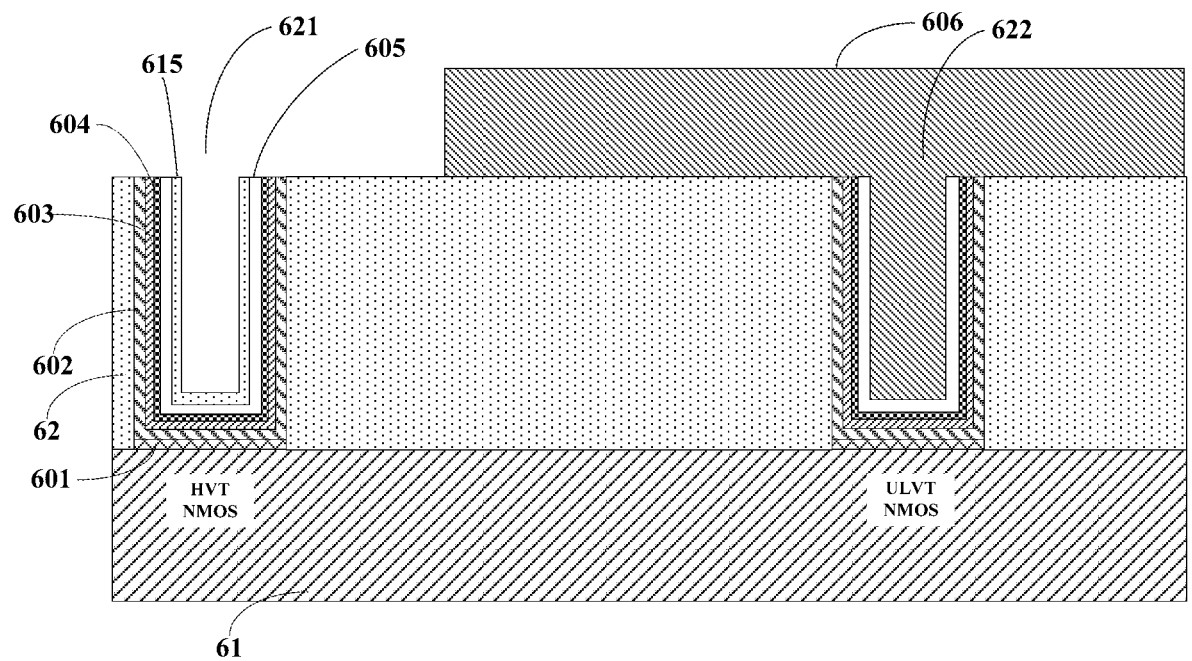
Figure 6C:
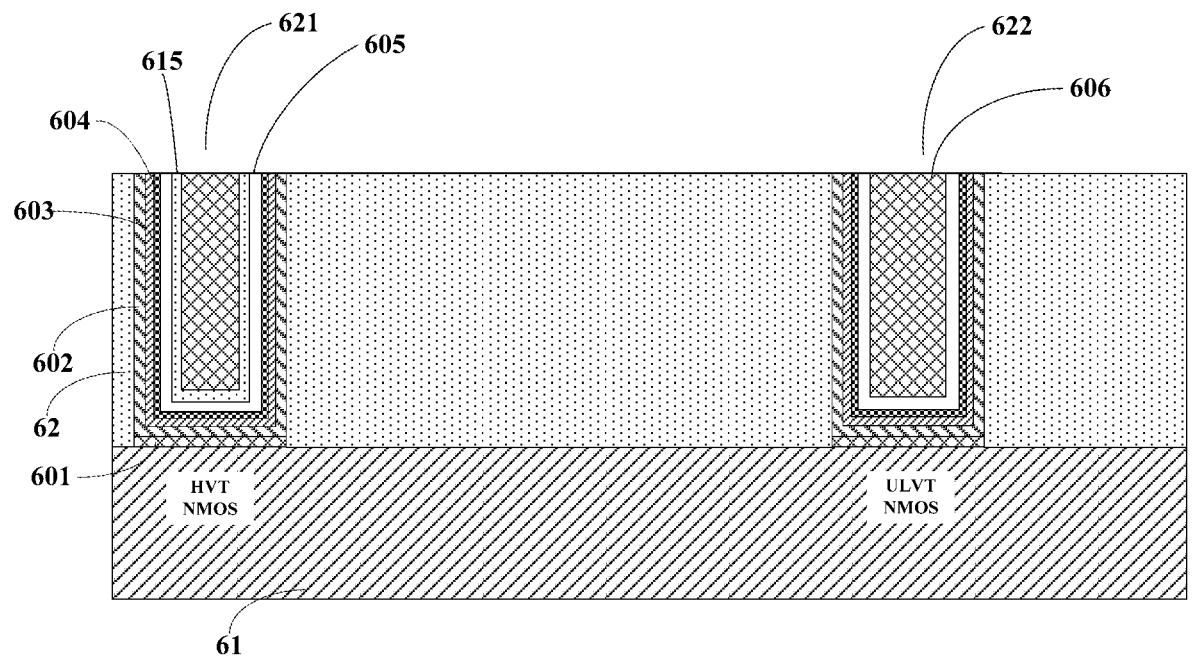

FIG. 5 is a simplified flowchart illustrating a method of manufacturing a semiconductor device according to another embodiment of the present invention. FIGS. 6A to 6C are cross-sectional views illustrating intermediate stages of a semiconductor device in the manufacturing method according to another embodiment of the present invention.

A manufacturing method of a semiconductor device according to an embodiment of the present invention will be described in detail with reference to FIG. 5 and FIGS. 6A to 6C.

Referring to FIG. 5, a substrate structure is provided in step 502.

FIG. 6A is a cross-sectional views illustrating a substrate structure in the manufacturing method according to another embodiment of the present invention. Referring to FIG. 6A, the substrate structure includes a semiconductor substrate (e.g., a silicon substrate) 61, an interlayer dielectric layer 62 on semiconductor substrate 61, and a plurality of trenches extending through interlayer dielectric layer 62 to semiconductor substrate 61. In the embodiment, the plurality of trenches include a first trench 621 for a first NMOS device (e.g., an LVT NMOS device) and a second trench 622 for a second NMOS device (e.g., a ULVT NMOS device. The substrate structure also includes a dielectric layer 602 disposed on the surface of semiconductor substrate 61 at the bottom of the trenches and sidewalls of the trenches In one embodiment, dielectric layer 602 may include a high-k dielectric layer. In one embodiment, the high-k dielectric layer may include, but not limited to, one or more of the following materials: $La_2O_3$, $TiO_2$, $Ta_2O_5$, $ZrO_2$, BaZrO, $HfO_2$, HfZrO, HfZrON, HfLaO, HfSiO, HfSiON, LaSiO, AlSiO, HfTaO, HfTiO, (Ba, Sr) $TiO_3$, $Al_2O_3$, $Si_3N_4$, or nitrogen oxide. Dielectric layer 602 may be formed using a chemical vapor deposition (CVD), an atomic layer deposition (ALD), or physical vapor deposition (PVD) process. Dielectric layer 602 has a thickness in the range between 10 angstroms and 40 angstroms, e.g., 20 angstroms, 30 angstroms.

In one embodiment, an interface layer 601 may be formed on the surface of semiconductor substrate 61 at the bottom of the trenches, dielectric layer 602 is disposed on interface layer 601 and sidewalls of the trenches. Interface layer 601 may be an oxide or a nitrogen oxide. Interface layer 601 may be formed by thermal oxidation or by deposition such as CVD, ALD, or PVD. The thickness of interface layer 601 is in the range between 5 angstroms and 15 angstroms, e.g., 10 angstroms, 13 angstroms.

In one embodiment, a cap layer 603 and a barrier layer 604 are sequentially formed on dielectric layer 602 in the trenches. For example, cap layer 603 and barrier layer 604 may be formed by CVD, ALD, or PVD. In one embodiment, cap layer 603 may include, but not limited to, $Ti_xN_{1-x}$, where $0<x<1$. Cap layer 603 has a thickness in the range of 0 (zero) angstrom (i.e., cap layer 303 is omitted) and 30 angstroms, i.e., 10 angstroms, 20 angstroms. Cap layer 603 may block the diffusion of metal elements (e.g., Al) into the high-k dielectric layer in the subsequent formation of an NMOS work function adjustment layer to not affect the device stability and other performance parameters. In one embodiment, barrier layer 604 may include, but not limited to, TaN, and has a thickness in the range of 0 (zero) angstrom (i.e., barrier layer 604 is omitted) and 30 angstroms, i.e., 10 angstroms, 20 angstroms. Barrier layer 604 may serve as an etch stop layer for a subsequent etching process on the NMOS work function adjustment layer.

Referring back to FIG. 5, in step 504, an NMOS work function adjustment layer 605 is formed on dielectric layer 602 in the trenches, as shown in FIG. 6A. For example, NMOS work function adjustment layer 605 may be formed by CVD, ALD, or PVD. It is to be noted that, in the case where the substrate structure includes barrier layer 604, NMOS work function adjustment layer 605 is formed on barrier layer 604. In one embodiment, NMOS work function adjustment layer 605 may include, but is not limited to, TaC, Ti, Al, TiAl, or $Ti_xAl_{1-x}$ ($0<x<1$). In one embodiment, NMOS work function adjustment layer 605 has a thickness in the range between 10 angstroms and 100 angstroms, e.g., 30 angstroms, 50 angstroms, 80 angstroms, etc.

Next, referring back to FIG. 5, in step 506, an oxidation treatment is performed on the surface of NMOS work function adjustment layer 605 in first trench 621 to form a first oxide layer 615. For example, referring to FIG. 6B, a patterned first mask 606 is formed in second trench 622 while exposing first trench 621. First oxidation treatment is then performed using first mask 606 as a mask to form first oxide layer 615. Thereafter, first mask 606 is removed.

The process parameters of the first oxidation treatment may be referred to the first oxidation treatment described in the above-described embodiments.

Thereafter, in step 508, a metal electrode layer 606 is formed on the NMOS work function adjustment layer in the trenches (first and second trenches 621, 622).

A manufacturing method of a semiconductor device according to another embodiment of the present invention is described above. In the embodiment, the surface of the NMOS work function adjustment layer of one of the NMOS devices is subjected to an oxidation treatment to obtain an oxide layer, thereby forming NMOS devices having different threshold voltages. Comparing with the prior art, the embodiment of the present invention does not utilize a PMOS work function adjustment layer and can obtain NMOS devices with different threshold voltages by adjusting the amount of oxidation in the oxide layer on the surface of the NMOS work functional adjustment layer. For an NMOS device with a high threshold voltage, there is no need to form multiple PMOS work function adjustment layers in the trench, so that the problems of filling effect of the trench can be solved, e.g., the air gap in the trench for the metal electrode layer becomes larger.

The manufacturing methods of the above-described embodiments of the present invention are suitable for a planar device and a FinFET device. A semiconductor device may be manufactured according to the above-described manufacturing methods.

In one embodiment, referring to FIG. 3F, the semiconductor device may include a semiconductor substrate 301, an interlayer dielectric layer 32 on semiconductor substrate 301, a plurality of trenches (321, 322) extending through dielectric layer 32 to a surface of semiconductor substrate 301, and a dielectric layer 302 on the surface of semiconductor substrate 301 at the bottom and on sidewalls of the trenches.

The semiconductor device may further include an NMOS work function adjustment layer 305 on dielectric layer 302 in the trenches. The semiconductor device also includes a first oxide layer 315 on the surface of NMOS work function adjustment layer 305 in first trench 321 and a second oxide layer 325 on the surface of NMOS work function adjustment layer 305 in second trench 322. The semiconductor device also includes a metal electrode layer 308 on NMOS work function adjustment layer 305 in the trenches.

In another embodiment, referring to FIG. 4F, a semiconductor device is provided. The semiconductor device may include a semiconductor substrate 301, an interlayer dielectric layer 32 on semiconductor substrate 301, a plurality of trenches including first trench 321, second trench 322, and third trench 323 extending through dielectric layer 32 to a surface of semiconductor substrate 301. First trench 321 is used for forming a first NMOS device, second trench 322 is used for forming a second NMOS device and third trench 323 is used for forming a third NMOS device. The semiconductor device also includes a dielectric layer 302 on the surface of semiconductor substrate 31 at the bottom and on sidewalls of the trenches.

The semiconductor device may further include an NMOS work function adjustment layer 305 on dielectric layer 302 in the trenches. The semiconductor device also includes a first oxide layer 315 on the surface of NMOS work function adjustment layer 305 in first trench 321, and a second oxide layer 325 on the surface of NMOS work function adjustment layer 305 in second trench 322. First oxide layer 315 has an oxygen content that is smaller than the oxygen content of second oxide layer 325. The semiconductor device also includes a metal electrode layer 308 on NMOS work function adjustment layer 305 in the trenches.

In some embodiments, dielectric layer 302 of the semiconductor devices of FIGS. 3F and 4F each may include a high-k dielectric layer. Further, an interface layer 301 may be formed on the surface of semiconductor substrate 31 at the bottom of the trenches, and dielectric layer 302 is formed on interface layer 301 and on sidewalls of the trenches. In some other embodiments, a cap layer 303 and a barrier layer 304 are sequentially formed on dielectric layer 302 in the trenches. In this case, NMOS work function adjustment layer 305 is formed on barrier layer 304.

In yet another embodiment, referring to FIG. 6C, a semiconductor device is provided. The semiconductor device may include a semiconductor substrate 61, an interlayer dielectric layer 62 on semiconductor substrate 61, and a plurality of trenches extending through the interlayer dielectric layer to the surface of the semiconductor substrate. The plurality of trenches include first trench 321 for a first NMOS device and a second trench 322 for a second NMOS device. The semiconductor device also includes a dielectric layer 602 on the surface of semiconductor substrate 61 at the bottom and on sidewalls of the trenches.

The semiconductor device further includes an NMOS work function adjustment layer 605 on dielectric layer 602 in the trenches. The semiconductor device also includes a first oxide layer 615 on the surface of NMOS work function adjustment layer 605 in first trench 621, and a metal electrode layer 606 on NMOS work function adjustment layer 605 in the trenches.

In some embodiments, dielectric layer 602 may include a high-k dielectric layer. Further, the semiconductor device may also include an interface layer 601 on the surface of semiconductor substrate 61 at the bottom of the trenches, and dielectric layer 602 is formed on interface layer 601 and on sidewalls of the trenches.

In some other embodiments, the semiconductor device may also include a cap layer 603 and a barrier layer 604 that are sequentially formed on dielectric layer 602 in the trenches. In this case, NMOS work function adjustment layer 605 is formed on barrier layer 604.

In some embodiments, NMOS work function adjustment layer 305 or 605 may include TaC, Ti, Al, TiAl, or $Ti_xAl_{1-x}$ ($0<x<1$). Interface layer 301 or 601 may include oxide. High-k dielectric layer may include $La_2O_3$, $TiO_2$, $Ta_2O_5$, $ZrO_2$, BaZrO, $HfO_2$, HfZrO, HfZrON, HfLaO, HfSiO, HfSiON, LaSiO, AlSiO, HfTaO, HfTiO, (Ba, Sr) $TiO_3$, $Al_2O_3$, $Si_3N_4$, or nitrogen oxides. Cap layer 303 or 603 may include $Ti_xN_{1-x}$, where $0<x<1$. Barrier layer 304 or 604 may include TaN.

The foregoing descriptions of specific embodiments of the present invention have been presented for purpose of illustration and description. They are not intended to be exhaustive or to limit the invention to the precise forms disclosed, and obviously many modifications and variations are possible in light of the above disclosure. The exemplary embodiment has been described in order to best explain the principles of the invention and its practical application. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A method of manufacturing a semiconductor device, comprising:
    providing a substrate structure including a semiconductor substrate, an interlayer dielectric layer on the semiconductor substrate, a plurality of trenches extending through the interlayer dielectric layer to the semiconductor substrate and including a first trench of a first NMOS device and a second trench of a second NMOS device, and a dielectric layer on sidewalls and a bottom of the trenches on the semiconductor substrate;
    forming an NMOS work function adjustment layer on the dielectric layer in the trenches;
    performing a first oxidation treatment on the NMOS work function adjustment layer in the first trench to form a first oxide layer;
    performing a second oxidation treatment on the NMOS work function adjustment layer in the second trench to form a second oxide layer, the first oxide layer having an oxygen content lower than an oxygen content of the second oxide layer; and
    forming a metal electrode layer on the NMOS work function adjustment layer in the trenches after performing the first and second oxidation treatments.

2. The method of claim 1, wherein performing the first oxidation treatment comprises:
    forming a patterned first mask in the second trench while exposing the first trench;
    performing the first oxidation treatment using the patterned first mask as a mask;
    removing the patterned first mask;
    the method further comprising, after performing the first oxidation treatment:
    forming a patterned second mask in the first trench while exposing the second trench;
    performing the second oxidation treatment using the patterned second mask as a mask; and
    removing the patterned second mask.

3. The method of claim 1, wherein the plurality of trenches further comprise a third trench of a third NMOS device, and performing the first oxidation treatment comprises:
    forming a patterned first mask in the second trench and the third trench while exposing the first trench;
    performing the first oxidation treatment using the patterned first mask as a mask;
    removing the patterned first mask;
    the method further comprising, after performing the first oxidation treatment:
    forming a patterned second mask in the first trench and the third trench while exposing the second trench;
    performing the second oxidation treatment using the patterned second mask as a mask; and
    removing the patterned second mask.

4. The method of claim 1, wherein performing the first oxidation treatment and the second oxidation treatment each comprise:
    performing an annealing in an environment containing oxygen; or
    performing a plasma oxidation treatment.

5. The method of claim 1, wherein the dielectric layer comprises a high-k dielectric layer; and the method further comprising forming an interface layer on the bottom of the trenches on the semiconductor substrate; and the dielectric layer is formed on the interface layer and on the sidewalls of the trenches.

6. The method of claim 5, further comprising:
    forming a cap layer on the dielectric layer; and
    forming a barrier layer on the cap layer; wherein the NMOS work function adjustment layer is on the barrier layer.

7. The method of claim 6, wherein:
    the NMOS work function adjustment layer comprises TaC, Ti, Al, or $Ti_xAl_{1-x}$, where $0<x<1$;
    the interface layer comprises oxide or nitrogen oxide;
    the high-k dielectric layer comprises $La_2O_3$, $TiO_2$, $Ta_2O_5$, $ZrO_2$, BaZrO, $HfO_2$, HfZrO, HfZrON, HfLaO, HfSiO, HfSiON, LaSiO, AlSiO, HfTaO, HfTiO, (Ba, Sr) $TiO_3$, $Al_2O_3$, $Si_3N_4$, or nitrogen oxide,
    the cap layer comprises $Ti_xN_{1-x}$, where $0<x<1$; and
    the barrier layer comprises TaN.

8. The method of claim 1, wherein the plurality of trenches further comprise a third trench of a third NMOS device, the NMOS work function adjustment layer in the third trench does not have an oxide layer.

9. The method of claim 8, wherein the first NMOS device is a low-threshold voltage NMOS device, the second NMOS device is a high-threshold NMOS device, and the third NMOS device is an ultra-low threshold NMOS device.

10. A method of manufacturing a semiconductor device, comprising:
provoding a substrate structure including a semiconductor substrate, an interlayer dielectric layer on the semiconductor substrate, a plurality of trenches extending through the interlayer dielectric layer to the semiconductor substrate and including a first trench of a first NMOS device, a second trench of a second NMOS device, and a third trench of a third NMOS device, and a dielectric layer on sidewalls and a bottom of the trenches on the semiconductor substrate;
forming an NMOS work function adjustment layer on the dielectric layer in the trenches;
performing a first oxidation treatment on the NMOS work function adjustment layer in the first trench to form a first oxide layer;
performing a second oxidation treatment on the NMOS work function adjustment layer in the second trench to form a second oxide layer; and
forming a metal electrode layer on the NMOS work function adjustment layer in the trenches after performing the second oxidation treatment,
wherein the NMOS work function adjustment layer in the third trench does not have an oxide layer.

11. The method of claim 10, wherein performing the oxidation treatment comprises:
forming a patterned mask in the second trench while exposing the first trench;
performing the oxidation treatment using the patterned mask as a mask; and
removing the patterned mask.

12. The method of claim 10, wherein performing the oxidation treatment comprises:
performing an annealing in an environment containing oxygen; or
performing a plasma oxidation treatment.

13. The method of claim 10, wherein the dielectric layer comprises a high-k dielectric layer; and the method further comprising forming an interface layer on the bottom of the trenches on the semiconductor substrate; and the dielectric layer is formed on the interface layer and on the sidewalls of the trenches.

14. The method of claim 13, further comprising:
forming a cap layer on the dielectric layer; and
forming a barrier layer on the cap layer; wherein the NMOS work function adjustment layer is on the barrier layer.

15. The method of claim 14, wherein:
the NMOS work function adjustment layer comprises TaC, Ti, Al, or $Ti_xAl_{1-x}$, where $0<x<1$;
the interface layer comprises oxide or nitrogen oxide;
the high-k dielectric layer comprises $La_2O_3$, $TiO_2$, $Ta_2O_5$, $ZrO_2$, $BaZrO$, $HfO_2$, $HfZrO$, $HfZrON$, $HfLaO$, $HfSiO$, $HfSiON$, $LaSiO$, $AlSiO$, $HfTaO$, $HfTiO$, $(Ba, Sr) TiO_3$, $Al_2O_3$, $Si_3N_4$, or nitrogen oxide,
the cap layer comprises $Ti_xN_{1-x}$, where $0<x<1$; and
the barrier layer comprises TaN.

16. A semiconductor device, comprising:
a semiconductor substrate;
an interlayer dielectric layer on the semiconductor substrate;
a plurality of trenches extending through the interlayer dielectric layer to the semiconductor substrate and comprising a first trench of a first NMOS device, a second trench of a second NMOS device, and a third trench of a third NMOS device;
a dielectric layer on a bottom and sidewalls of the trenches;
an NMOS work function adjustment layer comprising a first oxide layer on the dielectric layer in the first trench and a second oxide layer on the dielectric layer in the second trench, the first oxide layer having an oxygen content lower than an oxygen content of the second oxide layer; and
a metal electrode layer directly on the first oxide layer and the second oxide layer of the NMOS work function adjustment layer,
wherein the NMOS work function adjustment layer in the third trench does not have an oxide layer.

17. The semiconductor device of claim 16, further comprising:
an interface layer on the bottom of the trenches on the semiconductor substrate; wherein the dielectric layer is on the interface layer and on the sidewalls of the trenches, and wherein the dielectric layer comprises a high-k dielectric layer.

18. The semiconductor device of claim 17, further comprising:
a cap layer on the dielectric layer; and
a barrier layer on the cap layer; wherein the NMOS work function adjustment layer is on the barrier layer.

19. The semiconductor device of claim 18, wherein:
the NMOS work function adjustment layer comprises TaC, Ti, Al, or $Ti_xAl_{1-x}$, where $0<x<1$;
the interface layer comprises oxide or nitrogen oxide;
the high-k dielectric layer comprises $La_2O_3$, $TiO_2$, $Ta_2O_5$, $ZrO_2$, $BaZrO$, $HfO_2$, $HfZrO$, $HfZrON$, $HfLaO$, $HfSiO$, $HfSiON$, $LaSiO$, $AlSiO$, $HfTaO$, $HfTiO$, $(Ba, Sr) TiO_3$, $Al_2O_3$, $Si_3N_4$, or nitrogen oxide,
the cap layer comprises $Ti_xN_{1-x}$, where $0<x<1$; and
the barrier layer comprises TaN.

20. The semiconductor device of claim 16, wherein the first NMOS device is a low-threshold voltage NMOS device, the second NMOS device is a high-threshold NMOS device, and the third NMOS device is an ultra-low threshold NMOS device.

* * * * *